US012713846B2

(12) United States Patent
Groechel et al.

(10) Patent No.: US 12,713,846 B2
(45) Date of Patent: Aug. 18, 2026

(54) SURFACE PROFILING AND TEXTURING OF CHAMBER COMPONENTS

(71) Applicant: APPLIED MATERIALS, INC., Santa Clara, CA (US)

(72) Inventors: David W Groechel, Los Altos Hills, CA (US); Michael R. Rice, Pleasanton, CA (US); Gang Grant Peng, Santa Clara, CA (US); Rui Cheng, Santa Clara, CA (US); Zubin Huang, Santa Clara, CA (US); Han Wang, Santa Clara, CA (US); Karthik Janakiraman, San Jose, CA (US); Diwakar Kedlaya, Santa Clara, CA (US); Paul L Brillhart, Pleasanton, CA (US)

(73) Assignee: Applied Materials Inc., Santa Clara, CA (US)

(*) Notice: Subject to any disclaimer, the term of this patent is extended or adjusted under 35 U.S.C. 154(b) by 0 days.

(21) Appl. No.: 16/718,029

(22) Filed: Dec. 17, 2019

(65) Prior Publication Data

US 2021/0183657 A1 Jun. 17, 2021

(51) Int. Cl.

| | |
|---|---|
| ***H10P 72/00*** | (2026.01) |
| ***C23C 16/52*** | (2006.01) |
| ***C23C 16/54*** | (2006.01) |
| ***C23C 16/56*** | (2006.01) |
| ***H10P 14/43*** | (2026.01) |
| ***H10P 72/30*** | (2026.01) |
| ***H10P 74/20*** | (2026.01) |

(52) U.S. Cl.

CPC .............. *H10P 14/43* (2026.01); *C23C 16/52* (2013.01); *C23C 16/54* (2013.01); *C23C 16/56* (2013.01); *H10P 72/0452* (2026.01); *H10P 72/0461* (2026.01); *H10P 74/203* (2026.01); *H10P 74/207* (2026.01); *H10P 72/3402* (2026.01)

(58) Field of Classification Search

None

See application file for complete search history.

(56) References Cited

U.S. PATENT DOCUMENTS

| | | | |
|---|---|---|---|
| 9,034,142 B2 | 5/2015 | Bartlett | |
| 2003/0168173 A1* | 9/2003 | Tamura | C23C 14/566 156/345.31 |

(Continued)

FOREIGN PATENT DOCUMENTS

| | | | |
|---|---|---|---|
| KR | 10-2019-0009533 A | 1/2019 | |
| KR | 2019-0009533 A | 1/2019 | |
| WO | WO-2010039760 A2 * | 4/2010 | H01J 37/32458 |

OTHER PUBLICATIONS

International Search Report and Written Opinion for PCT/US2020/065173 dated Mar. 29, 2021.
European Search Report for EP 20 90 2650 dated Dec. 6, 2023.

*Primary Examiner* — Karla A Moore
(74) *Attorney, Agent, or Firm* — Moser Taboada

(57) ABSTRACT

Methods and apparatus for surface profiling and texturing of chamber components for use in a process chamber, such surface-profiled or textured chamber components, and method of use of same are provided herein. In some embodiments, a method includes measuring a parameter of a reference substrate or a heated pedestal using one or more sensors and modifying a surface of a chamber component based on the measured parameter.

26 Claims, 4 Drawing Sheets

(56) References Cited

U.S. PATENT DOCUMENTS

2004/0056211 A1* 3/2004 Popiolkowski ....... H01J 37/317 219/121.14
2004/0266222 A1* 12/2004 Sata ................. H01L 21/67248 438/795
2005/0089699 A1* 4/2005 Lin ...................... C23C 14/564 427/140
2005/0279384 A1 12/2005 Guidotti
2006/0093756 A1* 5/2006 Rajagopalan ....... C23C 16/4404 427/569
2007/0134821 A1 6/2007 Thakur
2007/0196011 A1 8/2007 Cox et al.
2010/0212581 A1 8/2010 Noro et al.
2011/0220148 A1* 9/2011 Consiglio ........... C23C 16/4407 134/18
2012/0171389 A1* 7/2012 Dando .................... C23C 16/52 427/532
2012/0264051 A1* 10/2012 Angelov ................ B23Q 3/105 430/256
2012/0273005 A1* 11/2012 Ramachandran ...... G01N 21/94 134/18
2013/0164948 A1 6/2013 Romero et al.
2013/0284092 A1 10/2013 Wilson et al.
2016/0079096 A1 3/2016 Avoyan et al.
2016/0258061 A1 9/2016 Tsai et al.
2016/0343600 A1 11/2016 Parkhe
2016/0349621 A1 12/2016 Huang et al.
2017/0011975 A1* 1/2017 Vukovic ........... H01L 21/67248
2017/0309525 A1* 10/2017 Suzuki ............. H01L 21/67196
2017/0323768 A1 11/2017 Zhang et al.
2017/0350688 A1 12/2017 Boyd, Jr.
2018/0010243 A1 1/2018 Lee et al.
2019/0295845 A1 9/2019 Clark et al.
2021/0183657 A1 6/2021 Groechel
2023/0023764 A1* 1/2023 Groechel .......... H01J 37/32935
2023/0039670 A1 2/2023 Samulon

* cited by examiner

SURFACE PROFILING AND TEXTURING OF CHAMBER COMPONENTS

FIELD

Embodiments of the present disclosure generally relate to semiconductor processing equipment.

BACKGROUND

Integrated circuits comprise multiple layers of materials deposited by various techniques, including chemical vapor deposition (CVD) or atomic layer deposition (ALD). The deposition of materials on a semiconductor substrate via CVD or ALD is a typical step in the process of producing integrated circuits. The inventors have observed undesired non-uniformities in materials deposited on the substrate via CVD or ALD in certain applications. These non-uniformities lead to further costs incurred in planarizing or otherwise repairing the substrate prior to further processing or possible failure of the integrated circuit altogether.

Accordingly, the inventors have provided improved methods and apparatus for uniformly depositing materials on a substrate.

SUMMARY

Methods and apparatus for surface profiling and texturing of chamber components for use in a process chamber, such surface-profiled or textured chamber components, and method of use of same are provided herein. In some embodiments, a method includes measuring a parameter of a reference substrate or a heated pedestal using one or more sensors; and modifying a surface of a chamber component based on the measured parameter.

In some embodiments, a non-transitory computer readable medium for storing computer instructions that, when executed by at least one processor causes the at least one processor to perform a method includes measuring a parameter of a reference substrate or a heated pedestal using one or more sensors; and modifying a surface of a chamber component based on the measured parameter.

In some embodiments, a processing system includes a first process chamber having a slit valve door to facilitate transferring a reference substrate into and out of the first process chamber or having a heated pedestal disposed in the first process chamber; one or more sensors disposed in the first process chamber and configured to measure a parameter of the reference substrate or the heated pedestal; and a texturing tool disposed in a second process chamber to texturize a surface of a chamber component based on the measured parameter.

In some embodiments, a chamber component includes a body; and a surface of the body configured to face an interior of a process chamber, wherein the surface has a region with an emissivity that increases continuously from one end of the region to an opposite end of the region.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
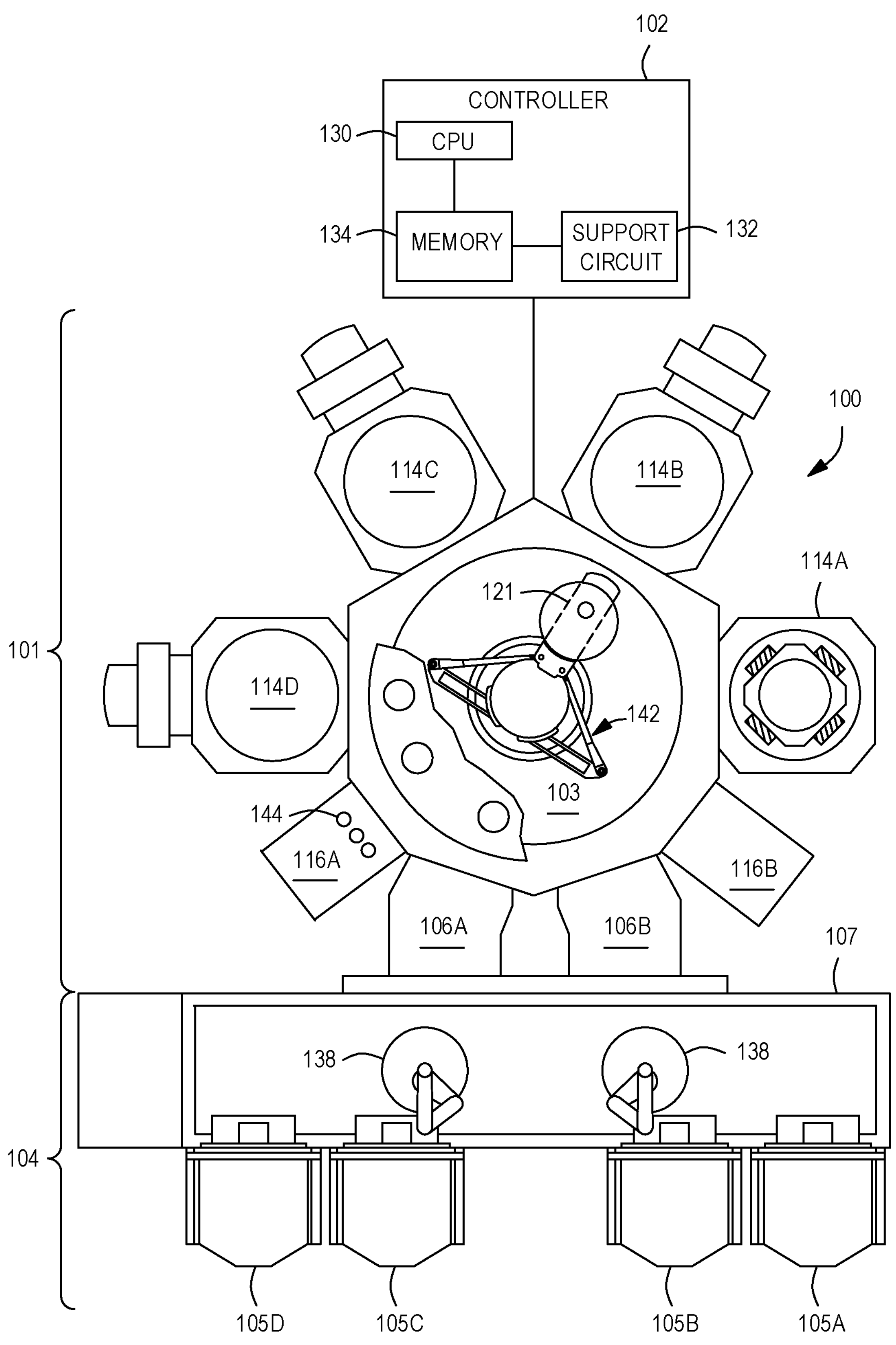
FIG. 1 depicts a cluster tool suitable to perform methods for processing a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for surface profiling and texturing of chamber components for use in a process chamber are provided herein. Chamber components having such profiled or textured surfaces and methods of use of same are also provided herein. The inventors have identified a correlation between measured substrate parameters or measured heated pedestal parameters and the surface profile of certain chamber components within the process chamber. The methods and apparatus are directed to modifying a surface of a chamber component based on measured parameters of a substrate or a heated pedestal. The resulting surface advantageously has a surface profile that improves film uniformity on a substrate during processing. The methods described herein may be performed in individual process chambers that may be provided in a standalone configuration or as part of a multi-chamber processing system, for example, a cluster tool.

FIG. 1 depicts a cluster tool 100 suitable to perform methods for processing a substrate in accordance with some embodiments of the present disclosure. Examples of the cluster tool 100 include the CENTURA® and ENDURA® tools, available from Applied Materials, Inc., of Santa Clara, California. The methods described herein may be practiced using other cluster tools having suitable process chambers coupled thereto, or in other suitable process chambers. For example, in some embodiments, the inventive methods discussed above may be advantageously performed in a cluster tool such that there are limited or no vacuum breaks between processing steps. For example, reduced vacuum breaks may limit or prevent contamination of any substrates being processed in the cluster tool.

The cluster tool 100 includes a vacuum-tight processing platform (processing platform 101), a factory interface 104, and a system controller 102. The processing platform 101 includes multiple processing chambers, such as 114A, 1146, 114C, and 114D, operatively coupled to a vacuum transfer chamber (transfer chamber 103). The factory interface 104 is operatively coupled to the transfer chamber 103 by one or more load lock chambers, such as 106A and 106B shown in FIG. 1.

In some embodiments, the factory interface 104 comprises at least one docking station 107 and at least one factory interface robot 138 to facilitate the transfer of the substrates. The at least one docking station 107 is configured to accept one or more front opening unified pod (FOUP). Four FOUPS, identified as 105A, 105B, 105C, and 105D, are shown in FIG. 1. The at least one factory interface robot 138 is configured to transfer the substrates from the factory interface 104 to the processing platform 101 through the load lock chambers 106A, 106B. Each of the load lock chambers 106A and 106B have a first port coupled to the factory interface 104 and a second port coupled to the transfer chamber 103. In some embodiments, the load lock chambers 106A and 106B are coupled to one or more service chambers (e.g., service chambers 116A and 116B). The load lock chambers 106A and 106B are coupled to a pressure control system (not shown) which pumps down and vents the load lock chambers 106A and 106B to facilitate passing the substrates between the vacuum environment of the transfer chamber 103 and the substantially ambient (e.g., atmospheric) environment of the factory interface 104.

The transfer chamber 103 has a vacuum robot 142 disposed therein. The vacuum robot 142 is capable of transferring substrates 121 between the load lock chamber 106A and 1066, the service chambers 116A and 1166, and the processing chambers 114A, 114B, 114C, and 114D. In some embodiments, the vacuum robot 142 includes one or more upper arms that are rotatable about a respective shoulder axis. In some embodiments, the one or more upper arms are coupled to respective forearm and wrist members such that the vacuum robot 142 can extend into and retract from any processing chambers coupled to the transfer chamber 103.

The processing chambers 114A, 114B, 114C, and 114D, are coupled to the transfer chamber 103. Each of the processing chambers 114A, 114B, 114C, and 114D may comprise a chemical vapor deposition (CVD) chamber, an atomic layer deposition (ALD) chamber, a physical vapor deposition (PVD) chamber, a plasma enhanced atomic layer deposition (PEALD) chamber, an annealing chamber, or the like. Other types of processing chambers can also be used where substrate process results are found to be dependent upon chamber component surface texturing as taught herein.

In some embodiments, one or more additional process chambers, such as the service chambers 116A and 1166, may also be coupled to the transfer chamber 103. In some embodiments, the service chambers 116A, 116B are coupled to the load lock chambers 106A and 106B, respectively, and operate under atmospheric pressure. The service chambers 116A and 116B may be configured to perform processes such as degassing, orientation, metrology, cool down, texturing, and the like. For example, service chamber 116A may be a metrology chamber that includes one or more sensors 144 to measure a parameter of a substrate disposed therein. While FIG. 1 shows the one or more sensors 114 disposed in service chamber 116A, the one or more sensors 114 may be disposed in one or more of the service chamber 1166 and/or the processing chambers 114A, 1146, 114C, or 114D.

The system controller 102 controls the operation of the cluster tool 100 using a direct control of the service chambers 116A and 116B and the process chambers 114A, 114B, 114C, and 114D or alternatively, by controlling the computers (or controllers) associated with the service chambers 116A and 1166 and the process chambers 114A, 114B, 114C, and 114D. The system controller 102 generally includes a central processing unit (CPU) 130, a memory 134, and a support circuit 132. The CPU 130 may be one of any form of a general-purpose computer processor that can be used in an industrial setting. The support circuit 132 is conventionally coupled to the CPU 130 and may comprise a cache, clock circuits, input/output subsystems, power supplies, and the like. Software routines, such as processing methods as described above may be stored in the memory 134 and, when executed by the CPU 130, transform the CPU 130 into a specific purpose computer (system controller 102). The software routines may also be stored and/or executed by a second controller (not shown) that is located remotely from the cluster tool 100.

In operation, the system controller 102 enables data collection and feedback from the respective chambers and systems to optimize performance of the cluster tool 100 and provides instructions to system components. For example, the memory 134 can be a non-transitory computer readable storage medium having instructions that when executed by the CPU 130 (or system controller 102) perform the methods described herein. The recipe can include information relating to one or more parameters associated with one or more of the components of the cluster tool 100 or one or more substrates disposed on the cluster tool 100. For example, the system controller 102 can collect data from the one or more sensors 144.

Figure 2:
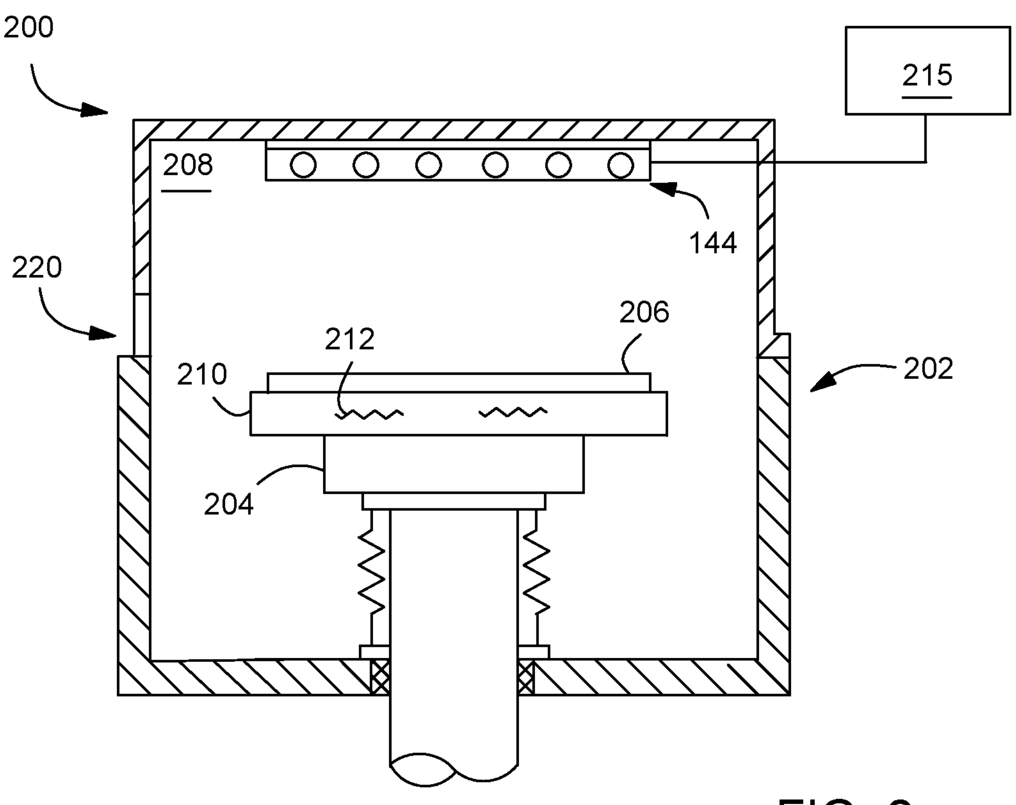
FIG. 2 depicts a schematic side view of a process chamber for measuring a parameter of a substrate or a heated pedestal in accordance with some embodiments of the present disclosure.

FIG. 2 depicts a simplified schematic side view of a process chamber 200 for measuring a parameter of a substrate or a heated pedestal in accordance with some embodiments of the present disclosure. In some embodiments, the process chamber 200 is a first process chamber. The process chamber 200 can be a standalone process chamber or part of a cluster tool, such as the cluster tool 100 described above. In some embodiments, the process chamber 200 is one of the service chambers 116A or 116B or one of the process chambers 114A, 114B, 114C, or 114D.

The process chamber 200 includes a chamber body 202 that defines an interior volume 208. In some embodiments, the process chamber 200 includes a slit valve door 220 coupled to the chamber body 202 to facilitate transferring a reference substrate 206 into and out of the process chamber 200. In some embodiments, a substrate support 204 is disposed in the interior volume 208 to support the reference substrate 206. In some embodiments, the substrate support 204 includes a heated pedestal 210 having one or more heating elements 212 disposed therein. The one or more heating elements 212 are coupled to one or more power sources (not shown). The heated pedestal 210 may be placed in the process chamber 200 from a bottom or a top of the process chamber 200. In some embodiments, the one or more sensors 144 are disposed in the interior volume 208 opposite the substrate support 204. In some embodiments, the one or more sensors 144 are configured to measure a parameter of the reference substrate 206. In some embodiments, the one or more sensors 144 are configured to measure a parameter of the heated pedestal 210. In embodiments where the one or more sensors 144 are configured to measure a parameter of the heated pedestal 210, the reference substrate 206 is not disposed in the interior volume 208 such that the one or more sensors 144 have a clear line of sight of an upper surface of the heated pedestal 210. The one or more sensors 144 may comprise an array of detectors such as radiation detectors, an interferometer, an infrared camera, a spectrometer, or the like, to measure one or more parameters such as substrate temperature, substrate film thickness, dielectric constant, substrate film stress, or heated pedestal temperature. Although shown in FIG. 2 as disposed opposite the substrate support 204, alternatively or in combination, the one or more sensors 144 can be disposed in other locations, such as adjacent the slit valve door 220 such that the substrate parameter can be measured as the substrate is being introduced into or removed from the process chamber 200 (see for example, FIG. 4).

A controller 215 is coupled to the one or more sensors 144 to collect data from the one or more sensors 144 relating to the measured parameter of the reference substrate 206 or the heated pedestal 210. In some embodiments, the controller 215 may be configured and may function similar to the system controller 102. In some embodiments, the controller 215 is the system controller 102.

Figure 3A:
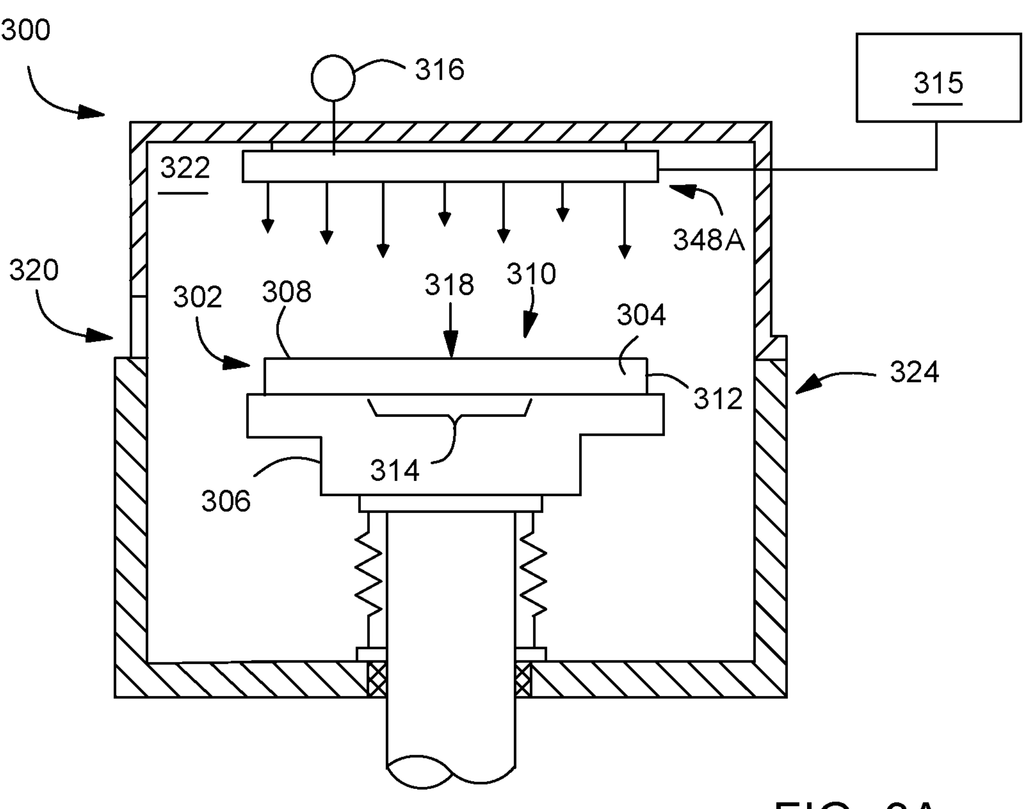
FIG. 3A depicts a schematic side view of a process chamber for texturing a chamber component in accordance with some embodiments of the present disclosure.
Figures 3B, 4:
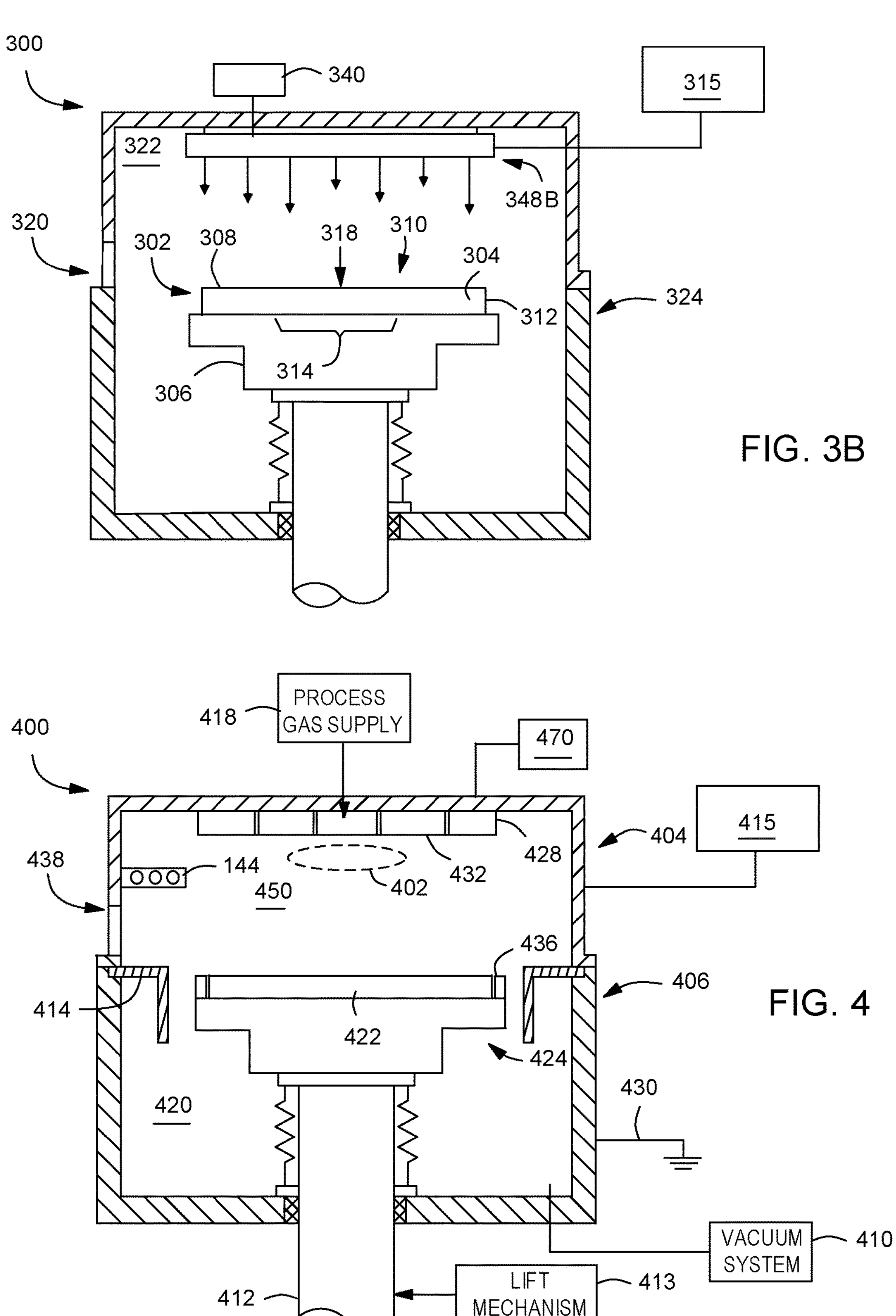
FIG. 3B depicts a schematic side view of a process chamber for texturing a chamber component in accordance with some embodiments of the present disclosure.
FIG. 4 depicts a schematic side view of a process chamber in accordance with some embodiments of the present disclosure.

FIG. 3A depicts a schematic side view of a process chamber 300 for texturing a chamber component 302 in accordance with some embodiments of the present disclosure. The chamber component 302 may be any component within a reference process chamber that includes a surface that is exposed to a processing volume of the reference process chamber. For example, the chamber component 302 can be a showerhead, a liner, a substrate support, a process kit, or the like, such as the showerhead 428, liner 414, substrate support 424, or process kit 436 described below with respect to FIG. 4. The process kit may include edge rings, deposition rings, cover rings, process shields, or the like. As shown in FIGS. 3A and 3B, the chamber component is a showerhead.

In some embodiments, the process chamber 300 is a second process chamber, different than the first process chamber (e.g., process chamber 200). Alternatively, in some embodiments, the process chamber 300 and the process chamber 200 are the same process chamber. The process chamber 300 can be a stand-alone process chamber. The process chamber 300 includes a chamber body 324 that defines an interior volume 322 and a slit valve door 320 coupled to the chamber body 324 to facilitate transferring a chamber component 302 for use in a process chamber (e.g., process chamber 400) into and out of the process chamber 300. The chamber component 302 may rest on a substrate support 306 disposed in the interior volume 322.

The chamber component 302 includes a body 304 and an edge 312. The body 304 includes a surface 308 that is exposed to a processing volume of the process chamber (e.g., processing volume 450 of process chamber 400 described below with respect to FIG. 4). A texturing tool 348A is disposed in the process chamber 300 to texturize the surface 308 of the chamber component 302 based on the parameter measured in process chamber 200. For example, for the showerhead, liner, substrate support, process kit, or the like, texturizing the surface 308 of the chamber component 302 could be a local modification to compensate for a local high or a local low deposition region on the reference substrate 206 or could be a global modification to create a profile that compensates for the substrate deposition profile.

In some embodiments, texturizing the surface 308 of the chamber component 302 comprises increasing a surface roughness of a region of the chamber component 302. In some embodiments, texturizing the surface 308 of the chamber component 302 comprises reducing a surface roughness of a region of the chamber component 302. In some embodiments, texturizing the surface 308 of the chamber component 302 comprises reducing the surface roughness in one region of the chamber component 302 and increasing the surface roughness in another region of the chamber component 302. Texturizing the surface 308 of the chamber component 302 advantageously allows for the control of the substrate temperature in a process chamber in which the chamber component 302 is installed, which in turn, facilitates control of film uniformity of a film formed in the process chamber.

In some embodiments, the texturing tool 348A is a laser texturing tool. The texturing tool 348A is coupled to a power source 316 to provide power to the texturing tool 348A. The texturing tool 348A is configured to use photon energy directed at the chamber component 302 to modify, or texturize, the surface 308 of the body 304 on a nanometer scale. In some embodiments, texturizing the surface 308 of the body 304 comprises modification of an emissivity profile of the surface 308. In some embodiments, texturizing the surface 308 of the body comprises modification of a surface area profile of the surface 308.

Emissivity is a measure of the efficiency in which a surface emits thermal energy. Typically, emissivity increases with an increase in surface roughness at a given temperature. For example, when texturizing the surface 308, any portions of the surface 308 made smoother generally decreases the emissivity of those portions and any portion of the surface 308 made rougher generally increases the emissivity of those portions. For thermally driven processes, thermal non-uniformities on the substrate lead to non-uniform deposition on the substrate. Changing the emissivity of chamber components in a first region, such as a central region, compared to a second region, such as an outer region, can advantageously counteract a process that normally results in non-uniform deposition, such as center-high, middle-high, or edge-high deposition, amongst other non-uniform deposition patterns or other process result patterns for processes other than deposition. Changing the emissivity of chamber components can also counteract local cool or hot spots on the substrate. Regions of different emissivity can make a substrate more thermally uniform and therefore the thermally driven process results are more uniform. In addition, the emissivity profile of the component can also be controlled to be purposely non-uniform, for example, to counter non-uniform processing results driven by factors other than thermal non-uniformity, such as plasma non-uniformity, non-uniformity of process gas distribution over the substrate, or the like.

FIG. 3B depicts a schematic side view of an alternate embodiment of the process chamber 300 for texturing a chamber component 302 in accordance with some embodiments of the present disclosure. In some embodiments, as shown in FIG. 3B, a texturing tool 348B is disposed in the process chamber 300 similar to texturing tool 348A described above with respect to FIG. 3A. Texturing tool 348B can be a water jetting tool, a bead blasting tool, a chemical texturing tool, or the like. The texturing tool 348B is coupled to a source material 340.

In embodiments where the texturing tool 348B is a water jetting tool, the source material 340 comprises water. The water jetting tool is configured to use high pressure water directed to the chamber component 302 to texturize the surface 308 of the chamber component 302.

In embodiments where the texturing tool 348B is a bead blasting tool, the source material 340 comprises abrasive material. The bead blasting tool is configured to direct abrasive material to the chamber component 302 to texturize the surface 308.

In embodiments where the texturing tool 348B is a chemical texturing tool, the source material 340 comprises a process fluid (e.g., a process gas, a process liquid, or combinations thereof). The chemical texturing tool is configured to direct the process fluid, with or without a mask layer disposed on the chamber component 302, to the chamber component 302 to texturize the surface 308. In some embodiments, the process fluid is applied to the surface 308 of the chamber component 302, followed by an initiator at a desired area of the surface 308 for a predetermined amount of time. The initiator may be a chemical, heat, or light. In some embodiments, the process fluid is an organic compound that can disassociate into an acid that will etch the surface 308 of the chamber component 302. In some embodiments, the chamber component is made of aluminum.

With respect to FIGS. 3A and 3B, a controller 315 is configured to provide instructions to the texturing tool 348A, 348B. In some embodiments, the controller 315 may be configured and function similar to the system controller 102. The controller 315 can provide instructions to the texturing tool 348A or the texturing tool 348B based on the data collected from the one or more sensors 144.

In some embodiments, post modification via the texturing tool 348A or the texturing tool 348B, the surface 308 has an emissivity profile with an irregular pattern. In some embodiments, the surface 308 post modification can have a region 310 with an emissivity that increases continuously from one end of the region 310 to an opposite end of the region 310. In some embodiments, the region 310 extends from a center 318 of the body 304 to an edge 312 of the body 304. In some embodiments, the body 304 includes a middle portion 314 and the region 310 extends from a center 318 of the body to an outer periphery of the middle portion 314. The outer periphery of the middle portion 314 is disposed between the center 318 and the edge 312. In some embodiments, the surface 308 of the body 304 has an emissivity profile mapped to a substrate (e.g., reference substrate 206) that is being processed in a given process chamber (e.g., process chamber 400).

In some embodiments, post modification via the texturing tool 348A or the texturing tool 348B, the surface 308 has a surface area profile with an irregular pattern. In some embodiments, the surface 308 post modification can have a region 310 with a surface area that increases continuously from one end of the region 310 to an opposite end of the region 310. In use, the inventors have observed an increase in concentration of process gas adjacent regions of the surface 308 with more local surface area, which can lead to increased reaction with a substrate being processed in the vicinity of regions with more local surface area. In some embodiments, the surface 308 of the body 304 has a surface area profile mapped to a substrate (e.g., reference substrate 206) that is being processed in a given process chamber (e.g., process chamber 400). In some embodiments, a plurality of (including all of) the chamber components 302 within a single process chamber may advantageously be texturized.

FIG. 4 depicts a schematic side view of a process chamber in accordance with some embodiments of the present disclosure. In some embodiments, the process chamber 400 is one of the processing chambers 114A, 114B, 114C, or 114D. The process chamber 400 can be a stand-alone process chamber or coupled to a vacuum transfer chamber (e.g., transfer chamber 103) of a cluster tool, such as the cluster tool 100 described above. In some embodiments, the process chamber 400 is a CVD chamber. However, chamber components of other types of processing chambers configured for different processes can also be modified as described herein.

The process chamber 400 includes a chamber body 406 covered by a lid 404 which defines an interior volume 420 therein. In some embodiments, the process chamber 400 is a vacuum chamber which is suitably adapted to maintain sub-atmospheric pressures within the interior volume 420 during substrate processing. The process chamber 400 may also include a process kit 436 or one or more liners 414 circumscribing various chamber components to prevent unwanted reaction between such components and process materials present within the interior volume 420. The chamber body 406 and lid 404 may be made of metal, such as aluminum. The chamber body 406 may be grounded via a coupling to ground 430.

A substrate support 424 is disposed within the interior volume 420 to support and retain a substrate 422. The substrate support 424 may generally comprise an electrostatic chuck, vacuum chuck, or the like to retain the substrate 422 thereon during processing. The substrate support 424 may include a heated pedestal similar to heated pedestal 210 discussed above with respect to FIG. 2. The substrate support 424 is coupled to a hollow support shaft 412 to provide a conduit to provide, for example, backside gases, process gases, fluids, coolants, power, or the like, to the substrate support 424. In some embodiments, the hollow support shaft 412 is coupled to a lift mechanism 413, such as an actuator or motor, which provides vertical movement of the substrate support 424 between a processing position and a lower, transfer position. The lift mechanism 413 may also provide for rotation of the substrate. Alternatively, a separate substrate rotation mechanism (e.g., a motor or drive) may be provided to rotate the substrate support 424, or the substrate support 424 may be rotationally fixed. The substrate support 424 may include lift pin openings (not shown) to accommodate lift pins (not shown) for raising and lowering the substrate 422 onto and off the substrate support 424.

The process chamber 400 is coupled to and in fluid communication with a vacuum system 410 which includes a throttle valve (not shown) and vacuum pump (not shown) which are used to exhaust the process chamber 400. The pressure inside the process chamber 400 may be regulated by adjusting the throttle valve and/or vacuum pump.

The process chamber 400 is also coupled to and in fluid communication with a process gas supply 418 which may supply one or more process gases to the process chamber 400 for processing the substrate 422 disposed therein. In some embodiments, a showerhead 428 is disposed in the interior volume 420 opposite the substrate support 424 to define a processing volume 450 therebetween. The showerhead 428 is configured to deliver the one or more process gases from the process gas supply 418 to the processing volume 450. The showerhead 428 includes a substrate facing surface 432 (e.g., surface 308). In operation, for example, a plasma 402 may be created in the processing volume 450 to perform one or more processes. The plasma 402 may be created by coupling power from a plasma power source (e.g., RF plasma power supply 470) to one or more process gases provided via the showerhead 428 to ignite the process gas and create the plasma 402. Bias RF power may be supplied to the substrate support 424 to attract ionized material formed in the plasma 402 towards the substrate 422.

The process chamber 400 has a slit valve door 438 to facilitate transferring the substrate 422 into and out of the process chamber 400. In some embodiments, the one or more sensors 144 are disposed in the process chamber 400 and configured to measure a parameter of the substrate 422. In some embodiments, the one or more sensors 144 are disposed at or near the slit valve door 438 and are configured to scan the substrate 422 as the substrate 422 is at least one of transferred into or out of the process chamber 400.

A controller 415 is coupled to the process chamber 400 to control the operation of the process chamber 400. In some embodiments, the controller 415 may be configured and function similar to the system controller 102. In some embodiments, the controller 415 is the system controller 102.

Figure 5:
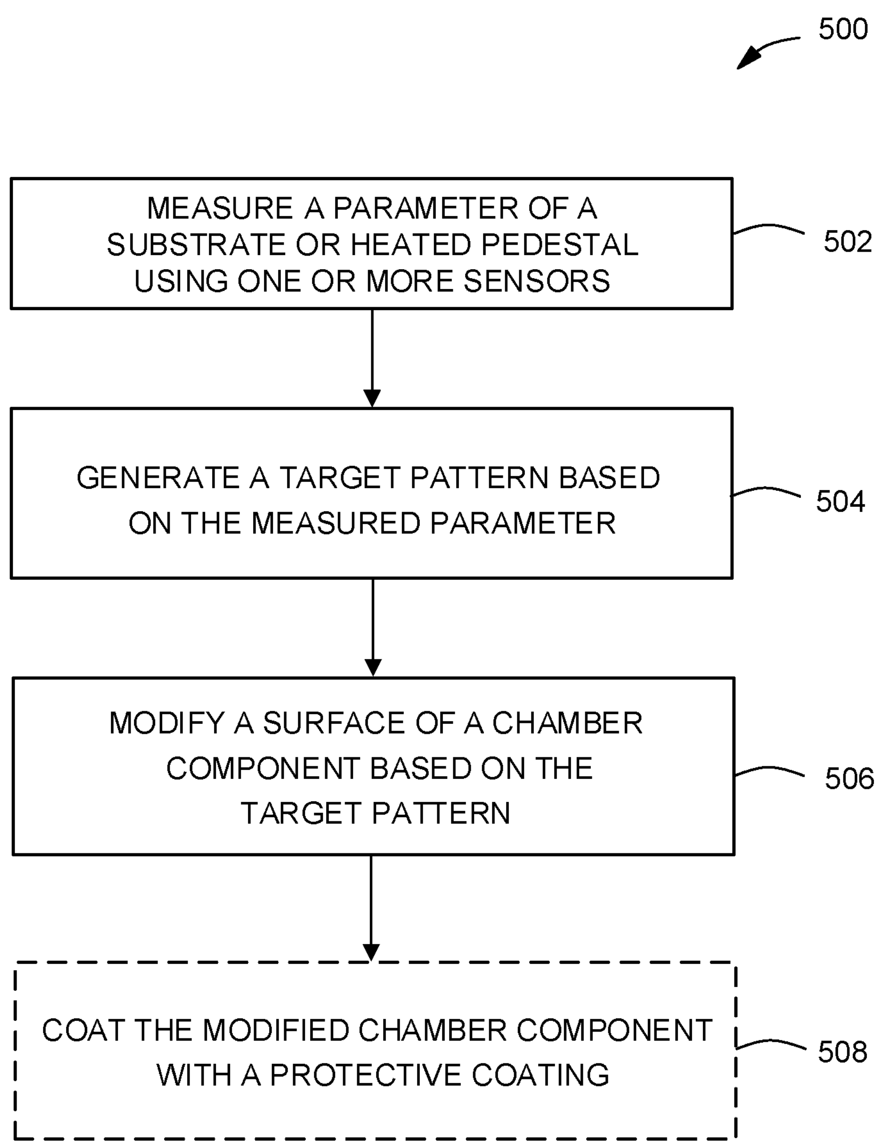
FIG. 5 depicts a method in accordance with some embodiments of the present disclosure.

FIG. 5 depicts a method 500 of modifying a chamber component in accordance with some embodiments of the present disclosure. The method 500 generally begins at 502, where a parameter of a substrate (e.g., reference substrate 206) is measured across a plurality of locations of the substrate using one or more sensors (e.g., one or more sensors 144). In some embodiments, the plurality of locations span across an entire surface of the substrate. In some embodiments, the plurality of locations relate to locations of repeating structures formed on the substrate (such as repeating dies). The substrate may be a semiconductor wafer, such as a 200 mm, 300 mm, 450 mm wafer, or the like, or any other type of substrate used in thin film fabrication processes. In some embodiments, the substrate may be any type of substrate that is suitable for display or solar applications. In some embodiments, the substrate may be a glass panel or a rectangular substrate.

In some embodiments, the parameter is at least one of substrate temperature, substrate film thickness, dielectric constant, or substrate film stress. In some embodiments, multiple parameters may be measured. In some embodiments, substrate temperature is not measured directly, but determined based on the measurement of at least one of the substrate film thickness, dielectric constant, or substrate film stress. The parameter of the substrate may be measured in a standalone process chamber or as part of a multi-chamber processing system, such as described above.

At 504, a target pattern is generated based on the measured parameter. In some embodiments, the target pattern is generated by applying a transfer function to the measured parameter of the substrate. In some embodiments, the transfer function is based on a single weighted input. In some embodiments, the transfer function is based on multiple weighted inputs. In some embodiments, where multiple parameters are measured, the transfer function is an average or a weighted average of a first transfer function of a first measured parameter and a second transfer function of a second measured parameter. In some embodiments, the transfer function is one of a polynomial transfer function, a differential equation transfer function, or a linear algebra transfer function. In some embodiments, the target pattern is a thermal map generated based on the measured parameter.

At 506, a surface of a chamber component is modified (e.g., with texturing tool 348A or texturing tool 348B) based on the target pattern. The surface of the chamber component (e.g., chamber component 302) may be modified in a second process chamber. In some embodiments, the second process chamber (e.g., process chamber 300) is different than the first process chamber (e.g., process chamber 200). Alternatively, in some embodiments, the second process chamber and the first process chamber are the same process chamber. In some embodiments, the surface of the chamber component is modified via laser, water jetting, bead blasting, or chemical texturing. In some embodiments, modifying the surface of the chamber component comprises providing the chamber component with a surface finish having regions of different emissivity. In some embodiments, modifying the surface of the chamber component comprises changing a surface area in different regions of the surface.

In some embodiments, measuring the parameter of the substrate or the heated pedestal and modifying the surface of the chamber component are done in a single process chamber. In some embodiments, measuring the parameter of the substrate or the heated pedestal and modifying the surface of the chamber component are done in different process chambers. In some embodiments, the parameter of the substrate is measured after the substrate is processed in a process chamber (e.g., process chamber 400), and the chamber component is installed in the process chamber after the surface of the chamber component is modified. In some embodiments, the modified chamber component is modified again according to the methods described herein after a suitable time period. In some embodiments, a suitable time period is about 6 months to about 18 months. In some embodiments, the modified chamber component is modified again based on the initial measured parameter of the substrate.

In some embodiments, the chamber component is aligned with respect to the texturing tool prior to being modified based on the target pattern such that the orientation of the substrate when measured correlates to the orientation of the chamber component in a predetermined manner prior to being modified. Once texturized by the texturing tool 348A or the texturing tool 348B, the chamber component can be removed from the second process chamber and installed on any reference process chamber.

In any of the foregoing, measuring the parameter of the substrate or the heated pedestal and modifying the surface of the chamber component can be performed in the same process chamber as any subsequent substrate processing or in a different process chamber than the subsequent substrate processing. At 508, the modified chamber component is optionally coated with a protective coating. In some embodiments, the protective coating comprises a chemically inert metal oxide, such as aluminum oxide ($Al_2O_3$), yttrium oxide ($Y_2O_3$), or the like. In some embodiments, measuring the parameter of the substrate or the heated pedestal and coating the chamber component is performed in the same process chamber and modifying the surface of the chamber component is performed in a different process chamber. In some embodiments, modifying the surface of the chamber component and coating the chamber component is performed in the same process chamber and measuring the parameter of the substrate or the heated pedestal is performed in a different process chamber. In some embodiments, the protective coating may be applied to the modified chamber component via a deposition process, such as CVD, ALD, PVD, evaporation, electron beam, or the like, inside a process chamber (e.g., process chamber 400). In some embodiments, once texturized by the texturing tool 348A or texturing tool 348B, the chamber component can be coated with the protective coating within the second process chamber and then removed from the second process chamber and installed in a reference process chamber.

While the foregoing is directed to embodiments of the present disclosure, other and further embodiments of the disclosure may be devised without departing from the basic scope thereof.

The invention claimed is:

1. A method, comprising:

measuring a parameter of a reference substrate using one or more sensors, wherein the measured parameter is a temperature of the reference substrate that is determined based on a measurement of at least one of a substrate film thickness, a dielectric constant, or a substrate film stress;

determining deposition film thickness non-uniformities across the reference substrate or thermal non-uniformities across the reference substrate based on the measured parameter; and texturizing a surface of a chamber component in a non-uniform manner based on the deposition film thickness non-uniformities or the thermal non-uniformities so that the texturized surface improves film uniformity on a substrate during processing, wherein texturizing the chamber component comprises at least one of:

making some portions of the chamber component smoother and making other portions of the chamber component rougher to provide the chamber component with a surface finish having regions of different emissivity, or changing a surface area in different regions of the surface.

2. The method of claim 1, wherein the one or more sensors are disposed in a process chamber and measuring the parameter comprises scanning the reference substrate as the reference substrate is transferred through the process chamber.

3. The method of claim 1, wherein the surface of the chamber component is texturized via laser, water jetting, bead blasting, or chemical texturing.

4. The method of claim 1, wherein measuring the parameter of the reference substrate and texturizing the surface of the chamber component are done in a single process chamber to improve film uniformity in the single process chamber during subsequent processing.

5. The method of claim 1, wherein measuring the parameter of the reference substrate and texturizing the surface of the chamber component are done in different process chambers.

6. The method of claim 1, further comprising applying a transfer function to the measured parameter of the reference substrate to generate a target pattern and the texturizing is based on the target pattern.

7. The method of claim 1, further comprising generating a thermal map based on the measured parameter and texturizing the surface of the chamber component based on the thermal map.

8. The method of claim 1, further comprising coating the chamber component with a protective coating after texturizing the surface of the chamber component.

9. The method of claim 8, wherein texturizing the surface of the chamber component and coating the chamber component are performed in a single process chamber.

10. The method of claim 8, wherein texturizing the surface of the chamber component and coating the chamber component is performed in different process chambers.

11. The method of claim 1, wherein texturizing the surface comprises a local modification to compensate for a local high or a local low deposition region on the reference substrate.

12. The method of claim 1, wherein texturizing the surface comprises a global modification to create a profile that compensates for a deposition profile of the reference substrate.

13. The method of claim 1, wherein the chamber component is aligned with respect to a texturing tool prior to being texturized based on a target pattern.

14. The method of claim 1, wherein measuring the parameter is of the reference substrate, and further comprising:

processing the reference substrate in a first process chamber prior to measuring the parameter, wherein texturizing the chamber component is done in a second process chamber different than the first process chamber; and installing the chamber component in the first process chamber after texturizing the chamber component.

15. The method of claim 1, wherein texturizing the surface comprises reducing the surface roughness in one region of the chamber component and increasing the surface roughness in another region of the chamber component.

16. A method, comprising:

measuring a parameter of a reference substrate using one or more sensors, wherein the measured parameter is a temperature of the reference substrate that is determined based on a measurement of at least one of a substrate film thickness, a dielectric constant, or a substrate film stress;

determining deposition film thickness non-uniformities across the reference substrate or thermal non-uniformities across the reference substrate based on the measured parameter;

texturizing a surface of a chamber component in a non-uniform manner based on the deposition film thickness non-uniformities or the thermal non-uniformities so that the texturized surface improves film uniformity on a substrate during processing, wherein texturizing the chamber component comprises at least one of:

making some portions of the chamber component smoother and making other portions of the chamber component rougher to provide the chamber component with a surface finish having regions of different emissivity, or changing a surface area in different regions of the surface; and applying a transfer function to the measured parameter of the reference substrate to generate a target pattern and the texturizing is based on the target pattern, wherein the transfer function is based on multiple weighted inputs of the measured parameter.

17. A non-transitory computer readable medium for storing computer instructions that, when executed by at least one processor causes the at least one processor to perform a method comprising:

measuring a parameter of a reference substrate using one or more sensors, wherein the measured parameter is a temperature of the reference substrate that is determined based on a measurement of at least one of a substrate film thickness, a dielectric constant, or a substrate film stress;

determining deposition film thickness non-uniformities across the reference substrate or thermal non-uniformities across the reference substrate based on the measured parameter; and texturizing a surface of a chamber component in a non-uniform manner based on the deposition film thickness non-uniformities or the thermal non-uniformities so that the texturized surface improves film uniformity on a substrate during processing, wherein texturizing the chamber component comprises at least one of:

making some portions of the chamber component smoother and making other portions of the chamber component rougher to provide the chamber component with a surface finish having regions of different emissivity, or changing a surface area in different regions of the surface.

18. The computer readable medium of claim 17, wherein the one or more sensors are disposed in a process chamber and measuring the parameter comprises scanning the reference substrate as the reference substrate is transferred through the process chamber.

19. The computer readable medium of claim 17, wherein the surface of the chamber component is texturizing via laser, water jetting, bead blasting, or chemical texturing.

20. The computer readable medium of claim 17, wherein measuring the parameter of the reference substrate and texturizing the surface of the chamber component are done in a single process chamber to improve film uniformity in the single process chamber during subsequent processing.

21. The computer readable medium of claim 17, wherein measuring the parameter of the reference substrate and texturizing the surface of the chamber component are done in different process chambers.

22. The computer readable medium of claim 17, further comprising applying a transfer function to the measured parameter of the reference substrate to generate a target pattern and the texturizing is based on the target pattern.

23. The computer readable medium of claim 17, further comprising generating a thermal map based on the measured parameter and texturizing the surface of the chamber component based on the thermal map.

24. The computer readable medium of claim 17, further comprising coating the chamber component with a protective coating after texturizing the surface of the chamber component.

25. The computer readable medium of claim 24, wherein texturizing the surface of the chamber component and coating the chamber component are performed in a single process chamber.

26. The computer readable medium of claim 24, wherein texturizing the surface of the chamber component and coating the chamber component is performed in different process chambers.

* * * * *